INVENTORS
WILHELM H. LEGAT
LEWIS K. RUSSELL
WARREN C. ROSVOLD

BY [signature]
AGENT

INVENTORS
WILHELM H. LEGAT
LEWIS K. RUSSELL
WARREN C. ROSVOLD
BY [signature]
AGENT United States Patent Office 3,423,651

Patented Jan. 21, 1969

3,423,651

MICROCIRCUIT WITH COMPLEMENTARY DIELECTRICALLY ISOLATED MESA-TYPE ACTIVE ELEMENTS

Wilhelm H. Legat, Woodside, Lewis K. Russell, Livermore, and Warren C. Rosvold, Sunnyvale, Calif., assignors to Raytheon Company, Lexington,, Mass., a corporation of Delaware Filed Jan. 13, 1966, Ser. No. 520,505

U.S. Cl. 317—235 12 Claims

Int. Cl. H01l 5/06; H03f 3/68

ABSTRACT OF THE DISCLOSURE

A microcircuit device comprising a number of complementary mesa-type active elements disposed on a common supporting matrix and dielectrically isolated from each other and from the matrix, and a method of making same which includes the step of forming the complementary active elements by preferentially etching the material along the [100] crystallographic axes.

This invention relates to microcircuit devices and has particular reference to semiconductor devices having a plurality of electrically isolated active areas or components located on a single chip. More particularly this invention is concerned with the provision of a differential amplifier comprised of matched microcircuit elements such as transistors mounted on a single chip, and with the method of fabricating such a device.

Isolated matched pairs of transistors made according to known prior art methods embodied two separately produced transistor chips mounted on electrically isolated tabs which were part of the header assembly. It was necessary that the transistors be individually made and thereafter selected for matching electrical characteristics before assembly. This required utilization of conventional and well-known transistor manufacturing techniques where a large number of transistors are initially formed, following which they are individually tested and charted to determine their particular electrical characteristics. Then it was necessary to select two or more thereof which possessed substantially identical electrical characteristics for incorporation into the required device. Assembly into such a device furthermore required that the matched transistors be individually insulatedly mounted upon electrically isolated tabs so that they could eventually be operated independently of one another in the manner of normal assembled components.

The disadvantages inherent in such prior art devices and methods are overcome in the present invention wherein a plurality of transistors are simultaneously formed on a single chip in electrically isolated relation to one another and with all the transistors automatically having substantially identical electrical characteristics. This is achieved in accordance with this invention by forming a layer of single crystal material of selected conductivity type and low resistivity upon a polycrystalline support and suitably isolated therefrom by an oxide layer. The single crystal layer is then covered by an epitaxial layer of higher resistivity and of the same conductivity type, following which mesas are formed by subjecting the single crystal material and epitaxial layer thereon to a sodium hydroxide etching solution which etches the material preferentially along the [100] crystal plane. The etching automatically stops at the isolating interface between the single crystal and polycrystal layers, thus effectively electrically isolating the thus-produced mesas from one another. All mesas thereafter are simultaneously provided with base, collector and emitter electrodes by conventional masking and diffusing techniques, and contacts are applied to complete the device.

All of the above and other objectives and advantages of this invention will become apparent from the following detailed description taken in conjunction with the accompanying drawings, wherein.

Figure 1:
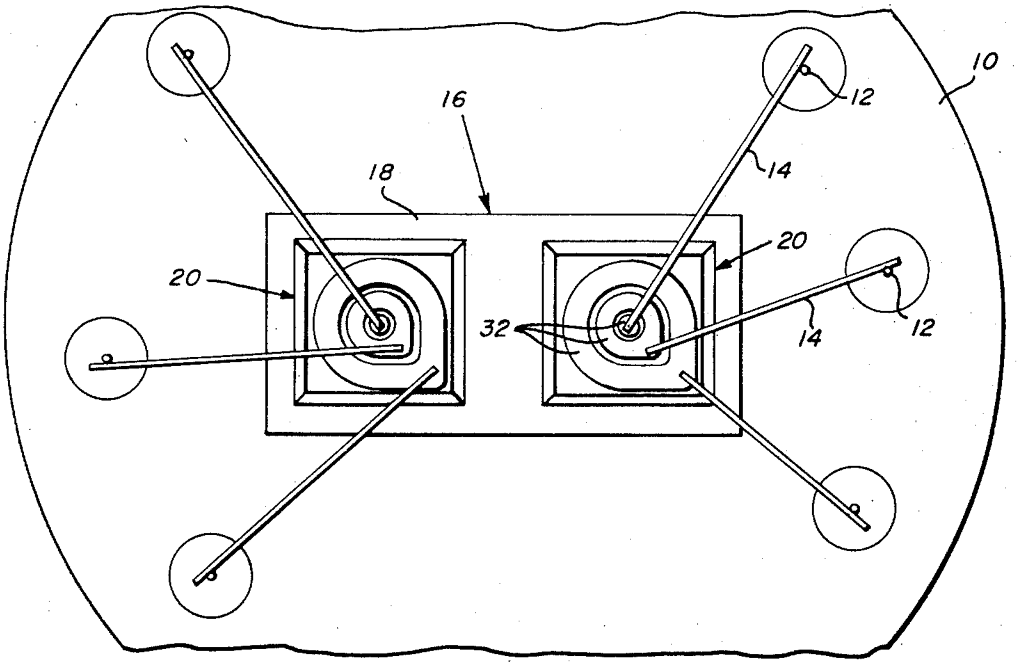
FIG. 1 is an elevational view of a microcircuit differential amplifier embodying the invention and mounted on a header.
Figure 2:
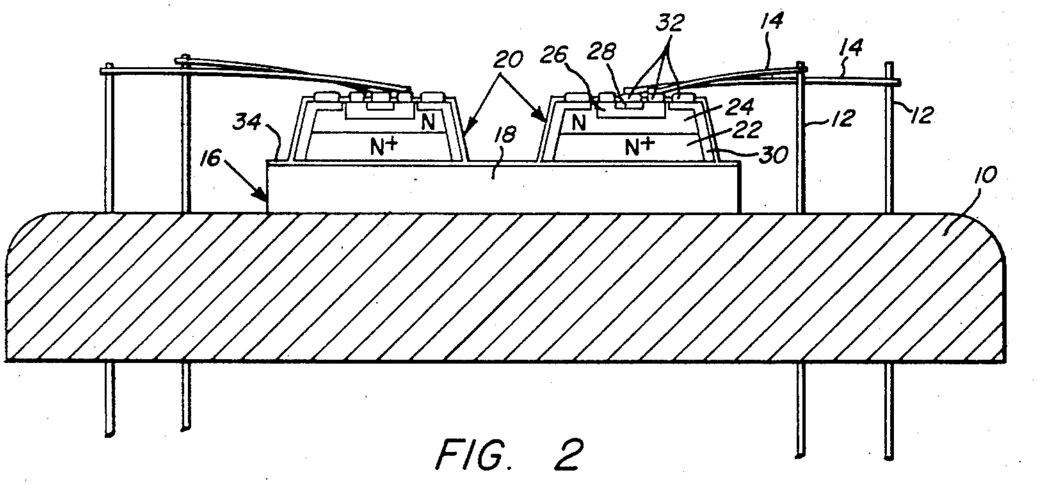
FIG. 2 is a vertical sectional view of the device illustrated in FIG. 1 taken through the transistor structures.

Referring more particularly to the drawings wherein like characters of reference designate like parts throughout the several views, FIGS. 1 and 2 illustrate an integrated circuit device embodying a preferred form of the invention fixed upon a suitable header 10 having leads 12 extending therethrough for connection by wires 14 to selected contacts forming a part of the integrated circuit device 16. Leads 12 are suitably insulated from the headers as by dielectric bushings or the like and are connected to external sources of potential, not shown, so as to provide the various electrodes with bias potentials as required.

Figure 3:
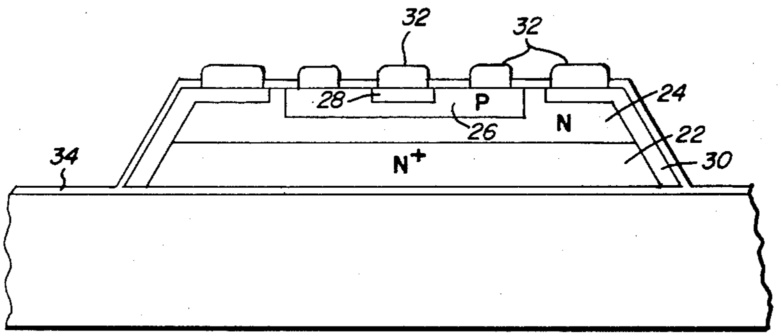
FIG. 3 is an enlarged vertical sectional view of a portion of the differential amplifier of FIG. 1.

Device 16 comprises a slab 18 of polycrystalline silicon upon which are located two transistors 20 which, in accordance with this invention, have substantially identical electrical characteristics. Each transistor 20 comprises a single crystal N+ layer 22 (FIGS. 2 and 3) upon which lies an epitaxially deposited N layer 24. Within layer 24 is diffused a P layer 26 which comprises the base electrode. The emitter electrode 28 is an N region diffused into P layer 26. The collector electrode is a diffused N+ layer 30 which overlies an annular peripheral area of the top surface of the mesa and extends downward over the sides of the mesa as shown best in FIG. 3. Contacts 32 are applied to the various electrodes, and a protective silicon dioxide coating 34 overlies the entire exposed surfaces of each transistor and extends between the transistors and the supporting polycrystalline layer 18. Thus the transistors are electrically insulated from each other but are located on the same chip.

To complete the device, connections are made to the contacts as shown in FIG. 1 whereby suitably bias potentials may be applied to the contacts from external potential sources (not shown).

While FIGS. 1 and 2 illustrate a device wherein only two transistors are shown, it is to be understood that more transistors may be incorporated within the device if desired, or a combination of electrical elements such as transistors, diodes, resistors, and the like. Two transistors were chosen in the present disclosure to more clearly illustrate how matched electrical elements may be simultaneously produced upon a common substrate according to this invention. Furthermore, this particular structure produces a novel differential amplifier in integrated form.

In the manufacture of the integrated circuit device embodying the invention, there is first provided a single crystal silicon chip or wafer which preferably has a resistivity of about .01 ohm cm. and less than about 2,000 dislocations per square centimeter. The crystal ingot from which the wafer is grown is sliced in the [100] plane and a flat is ground in the [110] plane. The flat is used for alignment in the proper crystallographic orientation which is necessary for the mesa etch process, to be hereinafter described. The wafer is processed by conventional lapping, polishing and etching processes to a desired resultant size, such as about six mils thick and one inch in diameter, for example.

The single crystal wafer or chip is suitably doped in any well known manner to provide it with N type conductivity characteristics and of such concentration of dopant as will provide the desired resistivity of about .005–.015 ohm cm. whereby the conductivity may be termed as N+. This wafer will eventually become the N+ layers 22 of the transistors 20 in FIGURE 2.

Figure 4:
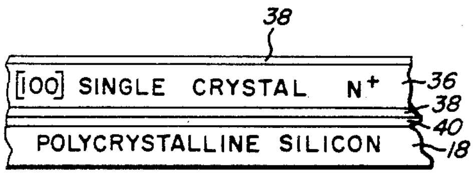
FIGS. 4, 5 and 6 are diagrammatic views illustrating various steps of the process of manufacturing a differential amplifier according to the invention.

The wafer, indicated by numeral 36 in FIG. 4, is prepared to receive a polycrystalline deposition by first oxidizing, whereupon it is coated with a layer 38 of silicon dioxide, this being done by any of the known thermal growing or other oxidation techniques to form the oxide film to a thickness of two to four (preferably three) microns. The side of the wafer which is to receive the polycrystalline support layer is coated with a photoresist material such as the solution known as KPR sold under that terminology by Eastman-Kodak Co., for example, and the coated wafer is prebaked to a temperature at which the photoresist decomposes and vaporizes, leaving a residue 40 which covers the silicon dioxide surface uniformly with nucleation centers.

At this point in the process the polycrystalline layer 18 is vacuum deposited upon the photoresist-coated side of wafer 36, the nucleation centers provided by the photoresist residue 40 serving the puprose during the deposition cycle of obtaining a fine-grained polycrystalline layer 18. To form layer 18, the wafer is placed in a furnace which is brought to a temperature of about 1200° C. at which time silicon tetrachloride is vaporized onto the water over the silicon dioxide coating 38 and photoresist residue or ash 40. This process is conventional and may be performed in a single step for about eighty minutes to form a layer 18 of about six mils thickness, or may be performed in a series of steps to provide several contiguous layers of polycrystalline silicon of the required thickness.

The side of the wafer 36 opposite layer 18 is then lapped, etched and polished by normal procedures to bring the thickness of this layer 36 down to about 1.5 to 2.5 mils. This of course removes the upper layer 38 of silicon dioxide.

Figure 5:
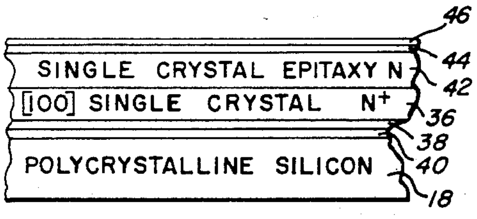

At this point there is epitaxially grown an arsenic doped N layer 42 (FIG. 5) on the polished surface of layer 36. This layer 42 is a single crystal epitaxy formed by growing silicon tetrachloride from vapor form onto layer 36 in a furnace at about 1200° C. for about eight minutes to produce a thickness of 14–16 microns. Layer 42 is doped with arsenic in an amount sufficient to provide it with a resistivity of about 3–5 ohms cm.

The wafer is now reoxidized to provide a layer 44 of silicon dioxide of about 2–3 microns thick thereover. This oxide layer is then masked with a photoresist pattern so as to define the areas in which mesas are to be formed.

The particular masking technique used here is not in itself unique insofar as this invention is concerned and, therefore, will be only briefly described herein. A photographic film is prepared with the desired pattern thereon, and the wafer is provided with a coating 46 of photoresist material, such as KPR, which overlies the silicon dioxide layer 44. Coating 46 is exposed through the film to ultra violet or other radiation to which it is sensitive, and developing then takes place by dipping the wafer in a solution such as trichloroethylene to remove unsensitized KPR. The wafer is then baked at about 150° C. for about 10 minutes whereupon the oxide supports thereon a resultant hardened photoresist mask 46 having the desired mesa configuration.

The wafer is then placed in a solution containing about one part of hydrofluoric acid (HF) and nine parts of ammonium fluoride ($NH_4F$) to etch away the exposed areas of silicon dioxide, following which it is rinsed in water and dried. The photoresist may now be removed by a solution of one part sulphuric acid and nine parts of nitric acid at about 100° C. for about ten minutes. However, the photoresist may be left on if desired because it will be automatically removed in the following mesa etching process.

Figure 6:
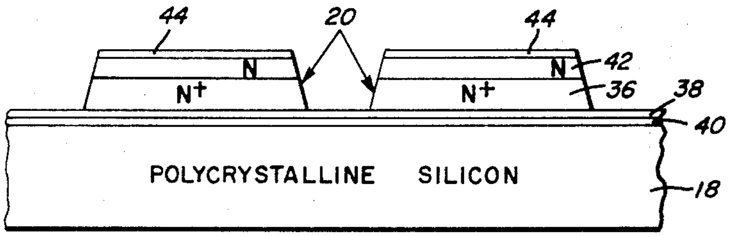

For mesa etching, the wafer is mounted as by a wax bond, pattern side up, on a glass slide, placed in a suitable rack, and heated in boiling water to preheat it to the temperature of the etching solution, that is, about 115° C. The etching solution is a saturated solution, i.e., at least 25% of sodium hydroxide (NaOH) in water, preferably in an amount of 33%. The preheated wafer is subjected to the etchant for the time necessary to etch the mesa to remove material down to the silicon dioxide layer 38 as shown in FIG. 6. This etching takes place along the [100] planes of the single crystal material as is explained more fully in copending U.S. application Ser. No. 520,506, filed Jan. 13, 1966 by Warren C. Rosvold and assigned to the same assignee as the present invention. Thus, there are produced two or more mesas 20. The height of the mesas will, of course, depend upon the thickness of layers 36 and 42. Therefore, in a device wherein layers 36 and 42 total a thickness of about four mils, the time required for etching the mesas will be about fifteen minutes. Etching is linear and continues unabated along the [100] cleavage planes until the silicon dioxide layer 38 is reached.

The device is then rinsed in deionized water and any remaining NaOH is neutralized by a solution of acetic acid, following which the device is again rinsed and dried.

All exposed silicon dioxide is now removed and the device is again reoxidized to provide a new relatively smooth layer of silicon dioxide one micron thick (for example). Then the base electrodes 26 (FIG. 3) are diffused into each mesa 20 by conventional diffusion techniques. Briefly, this is done by masking with KPR, removing silicon dioxide to open windows in the tops of the mesas and predepositing boron (P-type dopant) on the exposed N-layers 24 within the windows by placing the device in a furnace at about from 900° C.–1200° C. for about from 15–20 minutes, depending upon the particular concentration of impurities which are required to provide the resultant desired electrical characteristics in the device. For the differential amplifier of the present example, heating at about 950° C. for about 45 minutes will provide satisfactory results.

The device is then removed from the furnace and dipped in HF to remove boron from the oxide and then after testing is replaced in a furnace at about 1200° C. containing wet oxygen for about one hour to drive the boron into the N-layer. Here again the time required may be varied depending upon the resultant desired electrical characteristics. This also simultaneously reoxidizes the device. The P-N junction between the base 26 and N-layer 24 will, in this example, lie about 3.5–4 mils from the top of the mesa.

The emitter and collector electrodes 28 and 35 are diffused simultaneously by masking with KPR, opening windows in the oxide, and diffusing phosphorus or other N-type dopant from phosphorus oxychloride gas in a furnace at about 1100° C. for about 15 minutes, then subjecting the device to dry oxygen at a temperature of about 1100° C. for about 25 minutes to drive the phosphorus into the mesas to a depth of about 2–3 microns, for example. A dip in HF for several seconds then will remove undesired phosphate glass formed over the wafer by combination of the phosphorus and oxide.

Then the contact windows are opened in the required areas by photoresist masking and removing oxide, whereupon aluminum is evaporated by well known techniques over the device. Then by again masking with photoresist and then etching with any suitable aluminum etchant, the aluminum is removed from all areas except the contact areas overlying the respective electrodes. An organic solvent such as dibutyl Cellosolve is then used to remove the photoresist, and the aluminum is alloyed by heating in nitrogen to a temperature of about 610° C. for about ten minutes. These metallized regions then are affixed to the ends of the wires 14 (FIG. 1) which are connected to the leads 12 whereby the electrodes may be supplied with suitable biases from external sources.

It is to be understood that the methods set forth in the foregoing description are applicable to the simultaneous making of any number of matched transistors on a single wafer, and that the wafers are diced into pairs for use in the differential amplifier structure shown in FIG. 1, and thereafter sealed to the headers 10 before connection to the leads 12.

Thus, in accordance with this invention, the feasibility of fabricating matched, isolated transistor pairs on a common substrate has been demonstrated. It will be further understood that various modifications and changes in this invention may be made by those skilled in the art without departing from the spirit of the invention as expressed in the accompanying claims.

We claim:

1. An integrated circuit semiconductor device comprising a first layer of single crystal silicon of one conductivity-determining impurity type and of high electrical conductivity, a second layer of expitaxially grown silicon on said first layer of the same conductivity type but of greater electrical resistivity, a supporting layer upon which said first layer is mounted, dielectric insulating material between said first layer and said supporting layer, and a gap provided through said first and second layers and terminating at said dielectric insulation, said gap separating said combined first and second layers into a plurality of mesas, each of said mesas having a diffused base electrode in said second layer of a conductivity type opposite from said second layer, a diffused emitter electrode surrounded by said base electrode, and a collector electrode having at least a portion thereof surrounding said base electrode, said emitter and collector electrodes being of a conductivity type opposite from said base electrode.

2. An integrated circuit semiconductor device as set forth in claim 1 wherein the side walls of said gap extend along the [100] crystallographic axes of said first and second layers.

3. An integrated circuit semiconductor device as set forth in claim 1 wherein said mesas are electrically matched transistors.

4. An integrated circuit semiconductor device as set forth in claim 1 wherein said device is a differential amplifier and said mesas are a pair of electrically matched transistors.

5. An integrated circuit semiconductor device as set forth in claim 1 wherein said device is mounted on a heat conductive header, said electrodes are provided with metal contacts, and said header carries metal posts therein for connection to external sources of bias, said posts being electrically connected to selected contacts for supplying bias to said electrodes.

6. An integrated circuit semiconductor device according to claim 5 wherein said mesas are a pair of electrically matched transistors and said device is a differential amplifier.

7. An integrated circuit semiconductor device as set forth in claim 1 wherein said collector electrode further extends over the side walls of said mesas.

8. An integrated circuit semiconductor device as set forth in claim 1 wherein said electrodes have exposed metal contacts thereon and dielectric material covers the surfaces of each mesa with the exception of the metal contacts which remain exposed.

9. An integrated circuit semiconductor device as set forth in claim 1 wherein said supporting layer is polycrystalline silicon.

10. A method of making an integrated circuit device comprising forming a wafer of single crystal silicon having its [100] crystallographic axis extending substantially normal to the plane surfaces thereof, providing one side of said wafer with an insulated support, epitaxially depositing upon the other side of said wafer a layer of semiconductor material of the same conductivity type and of greater electrical resistance, masking said layer so as to expose only areas to be removed, etching said layer and wafer along the [100] crystallographic axes down to the insulated support to form a plurality of electrically isolated mesas, and providing said mesas with emitter, base and collector electrodes to form a plurality of transistors on a single chip.

11. A method of making an integrated circuit device as set forth in claim 10 wherein the respective electrodes are provided in the individual mesas simultaneously so as to provide all transistors with identical matching electrical characteristics.

12. A method of making an integrated circuit device as set forth in claim 10 comprising the additional steps of thereafter separating said chip into units each comprising two transistors on a single chip, mounting one of said units by its support upon a header provided with potential transmitting posts thereon, and connecting said posts to selected electrodes to form a differential amplifier.

References Cited

UNITED STATES PATENTS

| | | | |
|---|---|---|---|
| 3,088,856 | 5/1963 | Wannlund et al. | 148—33 |
| 3,131,098 | 4/1964 | Krsek et al. | 148—175 |
| 3,152,023 | 10/1964 | Minamoto | 148—177 |
| 3,232,799 | 2/1966 | Dash | 148—175 |
| 3,247,576 | 4/1966 | Dill et al. | 29—155.5 |
| 3,257,626 | 6/1966 | Marinace et al. | 331—94.5 |
| 3,308,354 | 3/1967 | Tucker | 317—234 |
| 3,312,879 | 4/1967 | Godejahn | 317—234 |
| 3,320,485 | 5/1967 | Buie | 317—101 |
| 3,327,182 | 6/1967 | Kisinko | 317—235 |
| 3,341,743 | 9/1967 | Ramsey | 317—101 |

OTHER REFERENCES

"The Minimization of Parasitics in Integrated Circuits by Dielectric Isolation," by Maxwell, Beeson & Allison, January 1965, IEEE Proceedings, pp. 20 to 25.

JOHN W. HUCKERT, *Primary Examiner.*

R. SANDLER, *Assistant Examiner.*

U.S. Cl. X.R.

29—580; 330—30